United States Patent
Uchida et al.

(10) Patent No.: US 10,964,604 B2
(45) Date of Patent: Mar. 30, 2021

(54) MAGNETIC STORAGE ELEMENT, MAGNETIC STORAGE DEVICE, ELECTRONIC DEVICE, AND METHOD OF MANUFACTURING MAGNETIC STORAGE ELEMENT

(71) Applicant: SONY SEMICONDUCTOR SOLUTIONS CORPORATION, Kanagawa (JP)

(72) Inventors: Hiroyuki Uchida, Kanagawa (JP); Masanori Hosomi, Tokyo (JP); Hiroyuki Ohmori, Kanagawa (JP); Kazuhiro Bessho, Kanagawa (JP); Yutaka Higo, Kanagawa (JP); Yo Sato, Kanagawa (JP); Naoki Hase, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 14 days.

(21) Appl. No.: 16/486,555

(22) PCT Filed: Dec. 8, 2017

(86) PCT No.: PCT/JP2017/044209
§ 371 (c)(1),
(2) Date: Aug. 16, 2019

(87) PCT Pub. No.: WO2018/159057
PCT Pub. Date: Sep. 7, 2018

(65) Prior Publication Data
US 2020/0058552 A1   Feb. 20, 2020

(30) Foreign Application Priority Data
Mar. 1, 2017  (JP) .............................. JP2017-038198

(51) Int. Cl.
*H01L 21/8239* (2006.01)
*G11C 11/16* (2006.01)
(Continued)

(52) U.S. Cl.
CPC ........ *H01L 21/8239* (2013.01); *G11C 11/161* (2013.01); *H01L 27/222* (2013.01);
(Continued)

(58) Field of Classification Search
CPC ... H01L 21/8239; H01L 27/222; H01L 29/82; H01L 43/08; H01L 43/12; G11C 11/161; G11C 11/5607
See application file for complete search history.

(56) References Cited

U.S. PATENT DOCUMENTS

| 6,943,394 B2 * | 9/2005 | Yoshihara | .............. B82Y 10/00 257/295 |
| 7,035,058 B2 * | 4/2006 | Hosomi | ................. B82Y 10/00 360/324.1 |

(Continued)

FOREIGN PATENT DOCUMENTS

| CN | 102479542 A | 5/2012 |
| CN | 102983272 A | 3/2013 |

(Continued)

OTHER PUBLICATIONS

International Search Report and Written Opinion of PCT Application No. PCT/JP2017/044209, dated Feb. 13, 2018, 09 pages of ISRWO.

*Primary Examiner* — John P. Dulka
(74) *Attorney, Agent, or Firm* — Chip Law Group

(57) ABSTRACT

To provide a magnetic storage element, a magnetic storage device, and an electronic device which store multi-value information with a simpler structure. A magnetic storage element provided with a plurality of tunnel junction ele-
(Continued)

ments each of which includes a reference layer having a fixed magnetization direction, a storage layer capable of reversing a magnetization direction, and an insulator layer interposed between the reference layer and the storage layer, the plurality of tunnel junction elements electrically connected to each other in parallel, in which the plurality of tunnel junction elements has film configurations identical to each other, respective layers of the film configurations formed by using a same material to have a same thickness, and each of cross-sectional shapes obtained by cutting the plurality of tunnel junction elements in a laminating direction is a polygonal shape including upper and lower sides parallel to each other with a ratio of the lower side to the upper side different for each of the plurality of tunnel junction elements.

10 Claims, 9 Drawing Sheets

(51) Int. Cl.
  *H01L 27/22* (2006.01)
  *H01L 29/82* (2006.01)
  *H01L 43/08* (2006.01)
  *H01L 43/12* (2006.01)

(52) U.S. Cl.
  CPC .............. *H01L 29/82* (2013.01); *H01L 43/08* (2013.01); *H01L 43/12* (2013.01)

(56) References Cited

U.S. PATENT DOCUMENTS

| | | | | |
|---|---|---|---|---|
| 7,112,861 | B2* | 9/2006 | Kanakasabapathy | H01L 43/12 257/421 |
| 7,193,287 | B2* | 3/2007 | Maesaka | B82Y 10/00 257/295 |
| 7,466,526 | B2* | 12/2008 | Sato | B82Y 10/00 257/421 |
| 8,072,789 | B2* | 12/2011 | Ikarashi | H01L 43/08 365/145 |
| 9,437,272 | B1 | 9/2016 | Lu et al. | |
| 10,069,064 | B1* | 9/2018 | Haq | H01L 27/222 |
| 10,707,413 | B1* | 7/2020 | Dutta | G11C 11/161 |
| 10,783,932 | B2* | 9/2020 | Higo | G11C 11/1675 |
| 2002/0136053 | A1 | 9/2002 | Asano et al. | |
| 2004/0085688 | A1* | 5/2004 | Pinarbasi | B82Y 25/00 360/324.2 |
| 2005/0073897 | A1 | 4/2005 | Miyatake et al. | |
| 2005/0276099 | A1* | 12/2005 | Horng | G11C 11/1675 365/158 |
| 2006/0227600 | A1 | 10/2006 | Miyatake et al. | |
| 2006/0256484 | A1* | 11/2006 | Sato | B82Y 25/00 360/324.2 |
| 2008/0094882 | A1 | 4/2008 | Asano et al. | |
| 2012/0134200 | A1 | 5/2012 | Khoueir et al. | |
| 2013/0051134 | A1 | 2/2013 | Kawahara et al. | |
| 2013/0058161 | A1 | 3/2013 | Yamanaka et al. | |
| 2014/0116984 | A1* | 5/2014 | Ding | G01R 33/093 216/22 |
| 2014/0170776 | A1* | 6/2014 | Satoh | H01L 43/12 438/3 |
| 2014/0248718 | A1* | 9/2014 | Kim | H01L 43/12 438/3 |
| 2014/0319521 | A1* | 10/2014 | Uchida | H01L 27/2481 257/43 |
| 2014/0349413 | A1* | 11/2014 | Chung | H01L 43/08 |
| 2016/0079519 | A1* | 3/2016 | Yoshikawa | H01L 43/08 257/421 |
| 2016/0204342 | A1* | 7/2016 | Hayashi | G11C 11/1673 438/3 |
| 2016/0267957 | A1 | 9/2016 | Lu et al. | |
| 2016/0336509 | A1* | 11/2016 | Jeong | H01L 21/02071 |
| 2016/0365509 | A1 | 12/2016 | Saida et al. | |
| 2017/0047510 | A1* | 2/2017 | Chen | H01L 27/222 |
| 2017/0062709 | A1* | 3/2017 | Kim | H01L 43/02 |
| 2017/0092845 | A1* | 3/2017 | Chuang | H01L 43/02 |
| 2018/0033957 | A1* | 2/2018 | Zhang | H01L 43/12 |
| 2019/0096461 | A1* | 3/2019 | Koike | H01L 43/02 |
| 2019/0280195 | A1* | 9/2019 | Sonoda | H01L 43/12 |
| 2020/0075842 | A1* | 3/2020 | Ohmori | H01F 10/16 |
| 2020/0111950 | A1* | 4/2020 | Chen | H01L 43/08 |
| 2020/0119088 | A1* | 4/2020 | Hashemi | H01L 27/222 |
| 2020/0119261 | A1* | 4/2020 | Holmes | H01L 27/226 |
| 2020/0212030 | A1* | 7/2020 | Chu | H01L 27/228 |
| 2020/0235292 | A1* | 7/2020 | Dai | H01L 43/12 |
| 2020/0350494 | A1* | 11/2020 | Dutta | H01L 43/12 |

FOREIGN PATENT DOCUMENTS

| | | |
|---|---|---|
| JP | 2002-230965 A | 8/2002 |
| JP | 2005-031829 A | 2/2005 |
| JP | 2012-119683 A | 6/2012 |
| JP | 2013-058522 A | 3/2013 |
| JP | 2014-041693 A | 3/2014 |
| JP | 2015-185581 A | 10/2015 |
| KR | 10-2012-0058425 A | 6/2012 |
| KR | 10-2013-0018798 A | 2/2013 |
| TW | 201312560 A | 3/2013 |
| WO | 2011/135984 A1 | 11/2011 |
| WO | 2015/141313 A1 | 9/2015 |
| WO | 2016/144436 A2 | 9/2016 |

* cited by examiner

MAGNETIC STORAGE ELEMENT, MAGNETIC STORAGE DEVICE, ELECTRONIC DEVICE, AND METHOD OF MANUFACTURING MAGNETIC STORAGE ELEMENT

CROSS REFERENCE TO RELATED APPLICATIONS

This application is a U.S. National Phase of International Patent Application No. PCT/JP2017/044209 filed on Dec. 8, 2017, which claims priority benefit of Japanese Patent Application No. JP 2017-038198 filed in the Japan Patent Office on Mar. 1, 2017. Each of the above-referenced applications is hereby incorporated herein by reference in its entirety.

TECHNICAL FIELD

The present disclosure relates to a magnetic storage element, a magnetic storage device, an electronic device, and a method of manufacturing the magnetic storage element.

BACKGROUND ART

In recent years, with improvement in performance of various information devices, higher integration, higher speed, and lower power consumption of storage devices incorporated in the various information devices are progressing. Therefore, the performance of storage elements using semiconductors is made high.

For example, as a large-capacity file memory, a flash memory is widely used in place of a hard disk drive. Furthermore, as a code storage or a working memory, in place of a NOR flash memory and a dynamic random access memory (DRAM), development of various types of storage elements such as a ferroelectric random access memory (FeRAM), a phase-change random access memory (PCRAM), and a magnetic random access memory (MRAM) is in progress.

Especially, the MRAM which stores information according to a magnetization direction of a magnetic body is attracting attention as the storage element for the code storage or the working memory because this may operate at a high speed and rewrite almost unlimitedly.

However, the MRAM which reverses magnetization by a current magnetic field generated from wiring has a problem in reducing power consumption and increasing capacity because efficiency of the magnetization reversal is low. Therefore, attention is focused on a spin transfer torque-magnetic random access memory (STT-MRAM) which causes the magnetization reversal without using the current magnetic field by using spin torque magnetization reversal.

Spin polarized electrons passing through a magnetic layer a magnetization direction of which is fixed apply torque in a magnetization direction of a magnetic layer which they enter when entering the magnetic layer the magnetization direction of which is free. In the STT-MRAM, the magnetization direction of the magnetic layer is reversed by using the torque by the spin polarized electrons. Such STT-MRAM may simplify a structure of a memory cell, and the smaller a volume of the memory cell, the smaller an amount of current required for the magnetization reversal of the magnetic layer may be made. Therefore, the STT-MRAM is expected as a non-volatile memory capable of reducing the power consumption and increasing the capacity.

Here, as a method of further increasing storage density of the STT-MRAM, it is studied to make information stored in each memory cell multi-value information.

For example, in Patent Document 1 below discloses a magnetic storage element in which stored information is made the multi-value information by laminating two tunnel junction elements (also referred to as magnetic tunnel junction (MTJ) elements) and electrically connecting them in series.

CITATION LIST

Patent Document

Patent Document 1: Japanese Patent Application Laid-Open No. 2005-31829

SUMMARY OF THE INVENTION

Problems to be Solved by the Invention

However, in the technology disclosed in Patent Document 1, the applied voltage required when rewriting the information stored in the magnetic storage element is the sum of the magnetization reversal voltages of the respective tunnel junction elements. Therefore, in the magnetic storage element disclosed in Patent Document 1, it was difficult to reduce the power consumption. Furthermore, in the magnetic storage element disclosed in Patent Document 1, there was a possibility that reliability is reduced because the structure is multilayered and complicated.

Thus, the present disclosure proposes novel and improved magnetic storage element, magnetic storage device, electronic device, and method of manufacturing the magnetic storage element capable of storing multi-value information with a simpler structure.

Solutions to Problems

According to the present disclosure, provided is a magnetic storage element provided with a plurality of tunnel junction elements each of which includes a reference layer having a fixed magnetization direction, a storage layer capable of reversing a magnetization direction, and an insulator layer interposed between the reference layer and the storage layer, the plurality of tunnel junction elements electrically connected to each other in parallel, in which the plurality of tunnel junction elements has film configurations identical to each other, respective layers of the film configurations formed by using a same material to have a same thickness, and each of cross-sectional shapes obtained by cutting the plurality of tunnel junction elements in a laminating direction is a polygonal shape including upper and lower sides parallel to each other with a ratio of the lower side to the upper side different for each of the plurality of tunnel junction elements.

According to the present disclosure, provided is a magnetic storage device in which a plurality of magnetic storage elements is arranged in an array, each of the magnetic storage elements provided with a plurality of tunnel junction elements each of which includes a reference layer having a fixed magnetization direction, a storage layer capable of reversing a magnetization direction, and an insulator layer interposed between the reference layer and the storage layer, the plurality of tunnel junction elements electrically connected to each other in parallel, in which the plurality of tunnel junction elements has film configurations identical to each other, respective layers of the film configurations formed by using a same material to have a same thickness, and each of cross-sectional shapes obtained by cutting the plurality of tunnel junction elements in a laminating direction is a polygonal shape including upper and lower sides parallel to each other with a ratio of the lower side to the upper side different for each of the plurality of tunnel junction elements.

According to the present disclosure, provided is an electronic device provided with: a magnetic storage unit in which a plurality of magnetic storage elements is arranged in an array, each of the magnetic storage elements provided with a plurality of tunnel junction elements each of which includes a reference layer having a fixed magnetization direction, a storage layer capable of reversing a magnetization direction, and an insulator layer interposed between the reference layer and the storage layer, the plurality of tunnel junction elements electrically connected to each other in parallel, the plurality of tunnel junction elements having film configurations identical to each other, respective layers of the film configurations formed by using a same material to have a same thickness, each of cross-sectional shapes obtained by cutting the plurality of tunnel junction elements in a laminating direction being a polygonal shape including upper and lower sides parallel to each other with a ratio of the lower side to the upper side different for each of the plurality of tunnel junction elements; and an arithmetic processing unit which executes information processing on the basis of information stored in the magnetic storage unit.

Furthermore, according to the present disclosure, provided is a method of manufacturing a magnetic storage element, the method including: a step of forming a laminate including a reference layer having a fixed magnetization direction, a storage layer capable of reversing a magnetization direction, and an insulator layer interposed between the reference layer and the storage layer; a step of forming a plurality of tunnel junction elements by dividing the laminate by etching; a step of changing a shape of at least the storage layer of the tunnel junction element which is etched by etching at least any one of the plurality of tunnel junction elements; and a step of electrically connecting the plurality of tunnel junction elements in parallel.

According to the present disclosure, it is possible to make the reversal voltages in the magnetization direction of each storage layer different by making the cross-sectional shapes in the laminating direction of the plurality of tunnel junction elements electrically connected in parallel different from each other.

Effects of the Invention

As described above, according to the present disclosure, it is possible to provide a magnetic storage element, a magnetic storage device, and an electronic device which store multi-value information with a simpler structure.

Note that the above-described effect is not necessarily limitative, and it is also possible that there is any one of the effects described in this specification or other effects which may be grasped from the present specification in addition to or in place of the above-described effect.

MODE FOR CARRYING OUT THE INVENTION

Figure 1:
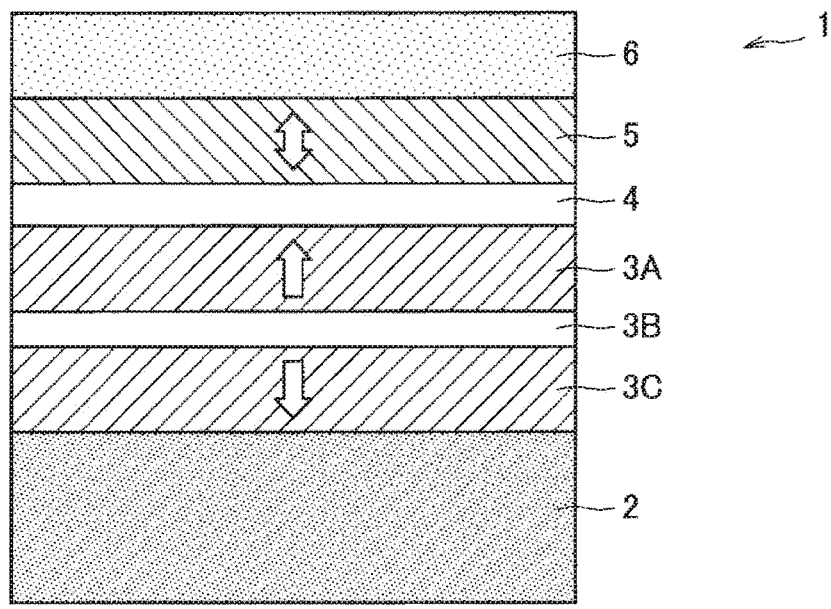
FIG. 1 is a cross-sectional view schematically illustrating a laminated structure of a magnetic storage element used in a STT-MRAM.

A preferred embodiment of the present disclosure is hereinafter described in detail with reference to the accompanying drawings. Note that, in this specification and drawings, the components having substantially the same functional configuration are assigned with the same reference sign, and the description thereof is not repeated. Furthermore, in this specification, a laminating direction of a substrate and the like on a support body is expressed as an upward direction.

Note that, the description is given in the following order.
1. Background Art of Present Disclosure
1.1. Overview of STT-MRAM
1.2. Configuration of STT-MRAM
1.3. Operation of STT-MRAM
2. Structure of Magnetic Storage Element
2.1. Configuration of Magnetic Storage Element
2.2. Specific Example
3. Manufacturing Method of Magnetic Storage Element
4. Example
5. Application Example of Magnetic Storage Element
5.1. Appearance Example of Electronic Device
5.2. Configuration Example of Electronic Device

1. Background Art of Present Disclosure

First, the background art of the present disclosure is described.

1.1. Overview of STT-MRAM

A non-volatile semiconductor storage element remarkably progresses as represented by a flash memory, and development is underway to expel storage devices of other than the semiconductor storage element such as a hard disk drive (HDD) device. Furthermore, development of a storage device including the non-volatile semiconductor storage element to a code storage for storing a program, operation parameters and the like, and a working memory for temporarily storing parameters and the like which appropriately change in executing the program in addition to a data storage is studied.

As a specific example of the non-volatile semiconductor storage element, for example, there may be a NOR or NAND flash memory. Furthermore, in addition, a FeRAM for storing information by remanent polarization of ferroelectric, a PCRAM for storing information in a phase state of a phase change film, an MRAM for storing information in a magnetization direction of a magnetic body, and the like are studied.

Especially, since the MRAM stores the information in the magnetization direction of the magnetic body, this may rewrite the information at a high speed and almost unlimitedly. Therefore, the MRAM is being especially actively developed, and in the fields of industrial automated devices, aircrafts, and the like, this is partially put into practical use.

However, it is difficult to reduce power consumption and increase a capacity as for the MRAM in which the magnetization of the magnetic body is reversed by a current magnetic field generated from wiring among the MRAMs due to a method of magnetization reversal. This is because current of approximately several mA is required to generate the current magnetic field of strength capable of reversing the magnetization of the magnetic body, and the power consumption at the time of writing increases. Furthermore, since it is required to prepare the wiring for generating the current magnetic field for each magnetic storage element, there is a limit in miniaturization of the magnetic storage element.

Therefore, the MRAM capable of reversing the magnetization direction of the magnetic body by a method other than that using the current magnetic field from the wiring is studied. Specifically, the MRAM which reverses the magnetization of the magnetic body by using spin torque magnetization reversal is studied.

The spin torque magnetization reversal is a method of reversing the magnetization utilizing, when spin polarized electrons passing through the magnetic body having the magnetization direction fixed in a predetermined direction enter another magnetic body, application of torque in the magnetization direction of the magnetic body which they enter. With this arrangement, the magnetization direction of the magnetic body through which the current (in other words, spin polarized electrons) equal to or higher than a threshold flows, and to which the torque equal to or larger than a threshold is applied is reversed in a direction parallel to the applied torque. Note that a direction of the torque applied to the magnetization direction of the magnetic body may be controlled by changing polarity of the current allowed to flow through the magnetic body.

Here, an absolute value of the current required to cause the spin torque magnetization reversal is approximately 1 mA or smaller for the magnetic storage element having a size of approximately 0.1 μm, and this decreases as a volume of the magnetic storage element decreases. Therefore, the MRAM (also referred to as a STT-MRAM) using the spin torque magnetization reversal may further reduce the current required at the time of writing, so that operation with low power consumption is available. Furthermore, in the STT-MRAM, since wiring such as a word line for generating the current magnetic field becomes unnecessary, it is possible to realize a much larger capacity by further miniaturizing the magnetic storage element.

As described above, the STT-MRAM has a characteristic of the MRAM capable of rewriting the information at a high speed and almost unlimitedly, and may achieve the low power consumption and large capacity, so that this attracts much attention as the non-volatile semiconductor storage element of high performance.

1.2. Basic Configuration of STT-MRAM

Next, with reference to FIG. 1, the magnetic storage element used in the STT-MRAM is described. FIG. 1 is a cross-sectional view schematically illustrating a laminated structure of a magnetic storage element 1 used in the STT-MRAM.

As illustrated in FIG. 1, the magnetic storage element 1 used in the STT-MRAM is provided with an underlayer 2, a magnetization fixing layer 3C provided on the underlayer 2, a magnetization coupling layer 3B provided on the magnetization fixing layer 3C, a reference layer 3A provided on the magnetization coupling layer 3B, an insulator layer 4 provided on the reference layer 3A, a storage layer 5 provided on the insulator layer 4, and a cap layer 6 provided on the storage layer 5.

The underlayer 2 controls crystal orientation of the magnetization fixing layer 3C laminated on the underlayer 2. For example, the underlayer 2 may be formed using a material having the crystal orientation or magnetic anisotropy substantially identical to that of the magnetization fixing layer 3C. Furthermore, in a case where the underlayer 2 is formed using a metal material, the underlayer 2 may also serve as a lower electrode of the magnetic storage element 1.

The magnetization fixing layer 3C is formed using a magnetic body including a ferromagnetic material, and is provided on the underlayer 2. The magnetization fixing layer 3C has a magnetization direction fixed in a predetermined direction (for example, downward in FIG. 1), and is magnetically coupled with the reference layer 3A via the magnetization coupling layer 3B to cancel out a leakage magnetic field from the reference layer 3A. Specifically, the magnetization fixing layer 3C may also include the ferromagnetic having a magnetic moment the magnetization direction of which is fixed in a direction perpendicular to a film surface. Note that, the magnetization direction of the magnetization fixing layer 3C may be upward (direction toward the cap layer 6) or downward (direction toward the underlayer 2) with respect to the direction perpendicular to the film surface.

The magnetization coupling layer 3B is formed using a non-magnetic material, and is provided so as to be interposed between the magnetization fixing layer 3C and the reference layer 3A. By magnetically coupling the magnetization fixing layer 3C and the reference layer 3A, the magnetization coupling layer 3B may stabilize a magnetization direction of the reference layer 3A and improve a retention characteristic of the magnetization direction of the reference layer 3A. The magnetization coupling layer 3B may also be formed using, for example, a non-magnetic metal material such as Cr, Cu, Ru, Re, Rh, Os, or Ir.

The reference layer 3A is formed using a magnetic body including a ferromagnetic material, and is provided on the magnetization fixing layer 3C via the magnetization coupling layer 3B. The reference layer 3A has a fixed magnetization direction (for example, upward in FIG. 1) antiparallel to the magnetization direction of the magnetization fixing layer 3C and serves as a criterion for a magnetization direction held in the storage layer 5. Since the reference layer 3A is magnetically coupled with the magnetization fixing layer 3C via the magnetization coupling layer 3B, the retention characteristic of the magnetization direction may be improved.

A structure including the magnetization fixing layer 3C, the magnetization coupling layer 3B, and the reference layer 3A using such magnetic coupling is also referred to as, for example, a laminated ferri-pin structure. Furthermore, a structure in which the laminated ferri-pin structure including the magnetization fixing layer 3C, the magnetization coupling layer 3B, and the reference layer 3A is provided below the storage layer 5 (in other words, an underlayer 2 side) is also referred to as a bottom-pin structure, and a structure in which the laminated ferri-pin structure is provided above the storage layer 5 (in other words, a cap layer 62 side) is also referred to as a top-pin structure. The magnetic storage element 1 may have either the bottom-pin structure or the top-pin structure.

The insulator layer 4 is formed using a non-magnetic material and is provided so as to be interposed between the reference layer 3A and the storage layer 5. The insulator layer 4 is interposed between the reference layer 3A and the storage layer 5 to form a tunnel junction element exhibiting a tunnel magneto resistance (TMR) effect.

The tunnel junction element may reverse the magnetization direction of the storage layer 5 by transferring spin torque between the storage layer 5 and the reference layer 3A via the spin polarized electrons passing through the insulator layer 4. Furthermore, in the tunnel junction element, electric resistance of the insulator layer 4 may be changed by a magneto resistance effect on the basis of whether the magnetization directions of the storage layer 5 and the reference layer 3A are parallel or antiparallel. With this arrangement, the magnetic storage element 1 may detect the magnetization direction (in other words, the stored information) of the storage layer 5 by measuring electrical resistance between the reference layer 3A and the storage layer 5.

Such insulator layer 4 may be formed by using, for example, various insulators such as $MgO$, $Al_2O_3$, $AlN$, $SiO_2$, $Bi_2O_3$, $MgF_2$, $CaF$, $SrTiO_2$, $AlLaO_3$, or Al—N—O, dielectrics, or semiconductors. Furthermore, in a case where the insulator layer 4 is formed using MgO, a magneto resistance change rate (in other words, an MR ratio) may be further increased. In a case where the MR ratio of the tunnel junction element is high, injection efficiency of the spin polarized electrons may be improved, so that current density required for the magnetization reversal of the storage layer 5 may be reduced.

Note that the insulator layer 4 may also include a metal material. In such a case, the magnetic storage element 1 may cause injection of the spin polarized electrons and resistance change by giant magneto resistance (GMR) effect in place of the tunnel magneto resistance effect.

The storage layer 5 is formed using a magnetic body including a ferromagnetic material and is provided on the insulator layer 4. Furthermore, the storage layer 5 is provided so that the magnetization direction of which is variable between parallel or antiparallel to the magnetization direction of the reference layer 3A. With this arrangement, the magnetic storage element 1 may store the information by a relative angle between the magnetization direction of the storage layer 5 and the magnetization direction of the reference layer 3A. Specifically, the storage layer 5 may also include a ferromagnetic having a magnetic moment a magnetization easy axis of which is directed in the direction perpendicular to the film surface and the magnetization direction of which freely changes. Note that the storage layer 5 may be formed as a single layer, may be formed as a laminate of the insulator layer and the magnetic layer, or may be formed as a laminate of an oxide layer and the magnetic layer.

For example, Co—Fe—B may be used as the ferromagnetic material forming the magnetization fixing layer 3C, the reference layer 3A, and the storage layer 5.

Since the magnetization fixing layer 3C and the reference layer 3A serve as a criterion for the information stored in the magnetic storage element 1, they are formed so that the magnetization directions are not changed by writing or reading of the information. However, it is not required that the magnetization directions of the magnetization fixing layer 3C and the reference layer 3A are completely fixed. For example, it is sufficient that the magnetization directions of the magnetization fixing layer 3C and the reference layer 3A are less likely to change than that of the storage layer 5 by increasing magnetic coercive force, increasing a film thickness, or increasing a magnetic damping constant. Furthermore, the magnetization directions of the magnetization fixing layer 3C and the reference layer 3A may also be fixed by contact with an antiferromagnetic layer including PtMn, IrMn or the like.

The storage layer 5 may also be formed so that magnitude of an effective demagnetizing field received by the storage layer 5 is smaller than a saturation magnetization amount Ms in writing the information or the like. For example, the magnetization direction of the storage layer 5 may be directed to the direction perpendicular to the film surface by forming the storage layer 5 using the ferromagnetic material having a Co—Fe—B composition and making the magnitude of the effective demagnetizing field received by the storage layer 5 smaller than the saturation magnetization amount Ms. In such a case, since the magnetic storage element 1 is formed as a perpendicular magnetization STT-MRAM, the power consumption may be reduced by reducing a current value for reversing the magnetization direction of the storage layer 5.

The cap layer 6 serves as a protective layer of the magnetic storage element 1. Furthermore, in a case where the cap layer 6 is formed using a metal material, the cap layer 6 may also serve as an upper electrode of the magnetic storage element 1.

The magnetic storage element 1 having such laminated structure may define "0" or "1" of the information by the relative angle between the magnetization direction of the storage layer 5 and the magnetization direction of the reference layer 3A, so that this may store the information.

Note that, in the magnetic storage element 1 described above, the magnetization directions of the magnetization fixing layer 3C, the reference layer 3A, and the storage layer 5 may be in an in-plane direction of the film surface. In other words, the magnetization fixing layer 3C and the reference layer 3A may be formed to have the magnetic moment the magnetization direction of which is fixed in the in-plane direction of the film surface, and the storage layer 5 may be formed to have the magnetic moment the magnetization easy axis of which is directed in the in-plane direction of the film surface. In such a case, the magnetic storage element 1 is formed as an in-plane magnetization STT-MRAM.

Although the laminated ferri-pin structure in which the reference layer 3A is magnetically coupled with the magnetization fixing layer 3C via the magnetization coupling layer 3B is described above, the laminated structure of the magnetic storage element 1 is not limited to above. For example, it is also possible that the magnetic storage element 1 is not provided with the magnetization coupling layer 3B and the magnetization fixing layer 3C, and does not form the laminated ferri-pin structure.

Furthermore, the magnetic storage element 1 may have a Dual-MTJ structure in which the insulator layer 4 and the reference layer 3A are provided on both surfaces of the storage layer 5 and two MTJ elements are formed on both surfaces of the storage layer 5, respectively.

1.3. Operation of STT-MRAM

Subsequently, writing of the information in the magnetic storage element 1 used for the STT-MRAM is described in more detail.

Electrons may take two types of spin angular momenta; in this case, they are temporarily defined as upward and downward momenta. According to this definition, in a non-magnetic body, the number of upward electrons and the number of downward electrons are the same, and in the ferromagnetic, the number of upward electrons and the number of downward electrons differ from each other.

Here, a case where the electrons are moved from the reference layer 3A to the storage layer 5 in the storage layer 5 and the reference layer 3A the magnetization directions of which are antiparallel to each other is considered. Since the magnetic moment of the reference layer 3A is fixed, the electrons passing through the reference layer 3A are so that the number of upward electrons differ from the number of downward electrons, and they are polarized in a polarization direction the same as that of the magnetic moment of the reference layer 3A (also referred to as spin polarized).

Here, in a case where the insulator layer 4 is sufficiently thin (for example, approximately several nm), the electrons passing through the reference layer 3A enter the storage layer 5 before the spin polarization is relaxed and the number of upward electrons becomes the same as the number of downward electrons (in other words, put into a non-polarized state).

In the storage layer 5, the spin polarization direction is opposite to the spin polarization direction of the electrons entering from the reference layer 3A. Therefore, in order to reduce energy of an entire system, a direction of the spin angular momentum is reversed for a part of the electrons entering from the reference layer 3A. However, since the spin angular momentum is preserved in the entire system, a reaction equal in amount to the sum of change amounts of the spin angular momentum of the reversed electrons is added to the magnetic moment of the storage layer 5.

In a case where the current flowing to the storage layer 5 is small, the number of electrons per unit time entering the storage layer 5 is also small, so that the sum of the spin angular momenta added to the magnetic moment of the storage layer 5 is also small. However, as an amount of the current flowing to the storage layer 5 increases, the sum of the spin angular momenta per unit time added to the magnetic moment of the storage layer 5 also increases. Then, in a case where the spin torque being a change in time of the spin angular momentum exceeds a threshold, the magnetic moment of the storage layer 5 starts precession motion and thereafter becomes stable in a state of being reversed by 180 degrees. Note that the magnetic moment of the storage layer 5 is stabilized in the state of being reversed by 180 degrees because the magnetization easy axis is present in the magnetic body forming the storage layer 5 and there is uniaxial anisotropy.

By the operation as described above, the magnetization direction of the storage layer 5 is reversed from a state antiparallel to the magnetization direction of the reference layer 3A to a parallel state. Therefore, in the magnetic storage element 1, the magnetization direction of the storage layer 5 may be reversed by injecting the electrons from the reference layer 3A to the storage layer 5 (in other words, applying the current from the storage layer 5 to the reference layer 3A).

On the other hand, in a case where the magnetization direction of the storage layer 5 is reversed in the storage layer 5 and the reference layer 3A the magnetization directions of which are parallel to each other, the electrons are injected from the storage layer 5 to the reference layer 3A (in other words, the current is applied from the reference layer 3A to the storage layer 5). In this case, the electrons entering the reference layer 3A are reflected by the reference layer 3A, so that the spin is reversed. The electrons with the reversed spin thereafter enter the storage layer 5. With this arrangement, the magnetic moment of the storage layer 5 receives the torque from the electrons with the reversed spin, so that in a case where the torque exceeds the threshold as described above, this is reversed in a direction antiparallel to the magnetization direction of the reference layer 3A.

As described above, in the magnetic storage element 1, the information is written in the storage layer 5 by applying the current of polarity corresponding to the information to be written in the tunnel junction element including the storage layer 5, the insulator layer 4, and the reference layer 3A equal to or larger than a threshold.

In more detail, in the perpendicular magnetization STT-MRAM, a threshold $I_{c\_perp}$ of the current (also referred to as reversal current) required for reversing the magnetization direction of the storage layer 5 is expressed by following expressions 1A and 1B. Note that expression 1A is an expression in a case of reversing the storage layer 5 having the magnetization direction parallel to the magnetization direction of the reference layer 3A, and expression 1B is an expression in a case of reversing the storage layer 5 having the magnetization direction antiparallel to the magnetization direction of the reference layer 3A.

[Formula 1]

$$I_{c\_perp}=(A\cdot\alpha\cdot Ms\cdot V/g(0)/P)(Hk-4\Pi Ms) \qquad \text{Expression 1A}$$

$$I_{c\_perp}=(A\cdot\alpha\cdot Ms\cdot V/g(\Pi)/P)(Hk-4\Pi Ms) \qquad \text{Expression 1B}$$

Furthermore, in the in-plane magnetization STT-MRAM, a threshold $I_{c\_para}$ of the current (also referred to as the reversal current) required for reversing the magnetization direction of the storage layer 5 is expressed by following expressions 2A and 2B. Note that expression 2A is an expression in a case of reversing the storage layer 5 having the magnetization direction parallel to the magnetization direction of the reference layer 3A, and expression 2B is an expression in a case of reversing the storage layer 5 having the magnetization direction antiparallel to the magnetization direction of the reference layer 3A.

[Formula 2]

$$I_{c\_para}=(A\cdot\alpha\cdot Ms\cdot V/g(0)/P)(Hk+4\Pi Ms) \qquad \text{Expression 2A}$$

$$I_{c\_para}=(A\cdot\alpha\cdot Ms\cdot V/g(\Pi)/P)(Hk+4\Pi Ms) \qquad \text{Expression 2B}$$

In expressions 1A to 2B described above, A represents a constant, α represents a damping constant, Ms represents saturation magnetization, V represents a volume of the storage layer 5, g(0) and g(Π) represent coefficients for efficiency with which the spin torque is transferred to the storage layer 5 parallel or antiparallel to the electron spin, P represents spin polarizability, and Hk represents an effective anisotropic magnetic field. Note that, with reference to expressions 1A to 2B above, it is understood that the perpendicular magnetization STT-MRAM may make the current value at the time of writing the information smaller than that of the in-plane magnetization STT-MRAM.

Therefore, the magnetic storage element 1 may reduce the current at the time of writing in the magnetic storage element using the magnetization reversal by the current magnetic field, and wiring for generating the current magnetic field is not required, so that low power consumption and large capacity are easily realized.

2. Structure of Magnetic Storage Element

2.1. Configuration of Magnetic Storage Element

Next, a structure of the magnetic storage element according to one embodiment of the present disclosure is described.

As described above, the STT-MRAM defines "0" or "1" of the information according to the relative angle between the magnetization direction of the storage layer 5 and the magnetization direction of the reference layer 3A. However, since the magnetization direction of the storage layer 5 is in two directions due to the uniaxial anisotropy, the information which may be stored by one tunnel junction element was up to binary information. Therefore, in order to further improve storage density of the STT-MRAM, it is studied to enable storage of multi-value information by using a plurality of tunnel junction elements.

For example, Patent Document 1 described above suggests the magnetic storage element capable of storing the multi-value information by laminating/forming the plurality of tunnel junction elements and electrically connecting them in series. However, in such magnetic storage element, since the plurality of tunnel junction elements is laminated/formed, the number of lamination of the magnetic storage element is increased, which complicates the structure and reduces reliability. Furthermore, in such magnetic storage element, a voltage required at the time of writing the information is the sum of magnetization reversal voltages of the tunnel junction elements, so that an increase in writing voltage causes an increase in power consumption.

The inventors of the present invention conceived of a technology according to the present disclosure by intensively studying the above-described problems and the like. The magnetic storage element according to the present embodiment may store the multi-value information without increasing the writing voltage by electrically connecting the plurality of tunnel junction elements in parallel.

Furthermore, in the magnetic storage element according to the present embodiment, the plurality of tunnel junction elements is formed to have cross-sectional shapes cut in the laminating direction different from each other. With this arrangement, since the magnetic storage element according to the present embodiment may more easily form the plurality of tunnel junction elements with different characteristics, the magnetization directions of the tunnel junction elements may be controlled with a higher degree of accuracy.

Figure 2:
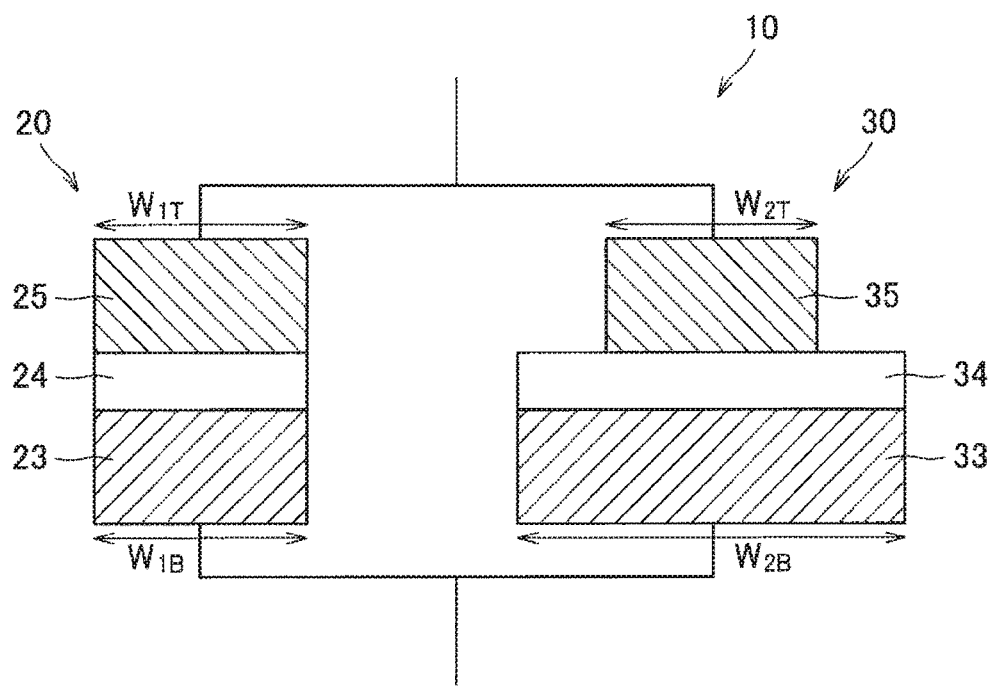
FIG. 2 is a schematic diagram illustrating a structure of a magnetic storage element according to one embodiment of the present disclosure.

Hereinafter, a structure of the magnetic storage element according to the present embodiment is specifically described with reference to FIG. 2. FIG. 2 is a schematic diagram illustrating a structure of a magnetic storage element 10 according to the present embodiment.

As illustrated in FIG. 2, the magnetic storage element 10 has a configuration in which a first tunnel junction element 20 and a second tunnel junction element 30 are electrically connected in parallel. Note that, in FIG. 2, electrodes and wiring connected to the first tunnel junction element 20 and the second tunnel junction element 30 are schematically illustrated.

The first tunnel junction element 20 is, for example, a tunnel junction element in which a first reference layer 23, a first insulator layer 24, and a first storage layer 25 are sequentially laminated. The first tunnel junction element 20 may control a magnetization direction of the first storage layer 25 by polarity of current flowing through the first tunnel junction element 20. Note that magnetization directions of the first reference layer 23 and the first storage layer 25 may be perpendicular to the film surface or in the in-plane direction. Furthermore, functions and materials of the first reference layer 23, the first insulator layer 24, and the first storage layer 25 are substantially similar to those of the reference layer 3A, the insulator layer 4, and the storage layer 5 illustrated in FIG. 1, so that the description thereof is omitted.

The second tunnel junction element 30 is, for example, a tunnel junction element in which a second reference layer 33, a second insulator layer 34, and a second storage layer 35 are sequentially laminated. The second tunnel junction element 30 may control a magnetization direction of the second storage layer 35 by polarity of current flowing through the second tunnel junction element 30. Note that magnetization directions of the second reference layer 33 and the second storage layer 35 may be perpendicular to the film surface or in the in-plane direction. Furthermore, functions and materials of the second reference layer 33, the second insulator layer 34, and the second storage layer 35 are substantially similar to those of the reference layer 3A, the insulator layer 4, and the storage layer 5 illustrated in FIG. 1, so that the description thereof is omitted.

Note that fixing directions of the magnetization of the first reference layer 23 and the second reference layer 33 may be made the same in order to simplify operation of the magnetic storage element 10.

Here, since the first tunnel junction element 20 and the second tunnel junction element 30 are electrically connected in parallel, the same voltage is applied when writing the information. Therefore, in a case where the reversal voltages of the magnetization directions of the first storage layer 25 and the second storage layer 35 are the same, the magnetic storage element 10 has difficulty in individually controlling the magnetization directions of the first storage layer 25 and the second storage layer 35. In the magnetic storage element 10 according to the present embodiment, characteristics of the first tunnel junction element 20 and the second tunnel junction element 30 (in other words, reversal voltages) are made different by providing a difference between the cross-sectional shapes of the first tunnel junction element 20 and the second tunnel junction element 30, so that they may be individually controlled.

Specifically, the cross-sectional shapes of the first tunnel junction element 20 and the second tunnel junction element 30 are polygonal shapes including upper and lower sides parallel to each other, and they are formed so that a ratio of the lower side to the upper side is different among the tunnel junction elements. For example, the second tunnel junction element 30 is formed so that a ratio $W_{2B}/W_{2T}$ of a width $W_{2B}$ of the lower side to a width $W_{2T}$ of the upper side of the cross-sectional shape is different from a ratio $W_{1B}/W_{1T}$ of a width $W_{1B}$ of the lower side to a width $W_{1T}$ of the upper side of the cross-sectional shape of the first tunnel junction element 20.

As a difference between $W_{2B}/W_{2T}$ in the cross-sectional shape of the second tunnel junction element 30 and $W_{1B}/W_{1T}$ in the cross-sectional shape of the first tunnel junction element 20 increases, a difference between the characteristics of the first tunnel junction element 20 and the second tunnel junction element 30 may be made larger. Note that $W_{1B}/W_{1T}$ and $W_{2B}/W_{2T}$ may be, for example, 0.5 or larger and 10 or smaller.

Furthermore, the cross-sectional shapes of the first tunnel junction element 20 and the second tunnel junction element 30 may be formed into polygonal shapes with different numbers of apices. For example, as illustrated in FIG. 2, in a case where the cross-sectional shape of the first tunnel junction element 20 is a quadrangle, the cross-sectional shape of the second tunnel junction element 30 may be a concave polygon obtained by combining a plurality of quadrangles.

Note that the cross-sections in the laminating direction of the first tunnel junction element 20 and the second tunnel junction element 30 are cross-sections cut along a plane including the center of planar shapes of the first tunnel junction element 20 and the second tunnel junction element 30. Furthermore, in a case where the planar shapes of the first tunnel junction element 20 and the second tunnel junction element 30 are not isotropic (not circular), the cross-sectional shapes of the first tunnel junction element 20 and the second tunnel junction element 30 are compared by the cross-sections cut in the same direction.

In a case where the cross-sectional shapes of the first tunnel junction element 20 and the second tunnel junction element 30 are different from each other, in the first tunnel junction element 20 and the second tunnel junction element 30, the reversal voltages of the first storage layer 25 and the second storage layer 35 are different from each other by the following action.

For example, with the tunnel junction element, the larger the element is, the larger the flowing current, and more Joule heat is generated. The Joule heat promotes the reversal of the magnetization direction of the storage layer by a thermal assist effect, so that the larger the tunnel junction element, the lower the reversal voltage of the storage layer may be made. Furthermore, in a case where the cross-sectional shape of the tunnel junction element is a concave polygon obtained by etching at least the storage layer, a magnetic film remaining around the storage layer has a magnetization component in the in-plane direction, so that the magnetization reversal of the storage layer having the magnetization direction perpendicular to the film surface is promoted. Therefore, in the tunnel junction element having such a cross-sectional shape, the reversal voltage of the storage layer may be reduced.

Therefore, in the first tunnel junction element 20 and the second tunnel junction element 30, the reversal voltages of the first storage layer 25 and the second storage layer 35 may be made different by making the cross-sectional shapes different. With this arrangement, the magnetic storage element 10 may individually control the magnetization directions of the first storage layer 25 and the second storage layer 35 by controlling the voltages applied to the first tunnel junction element 20 and the second tunnel junction element 30.

Operation of writing the information in the first tunnel junction element 20 and the second tunnel junction element 30 is described as follows. Note that the reversal voltage of the first storage layer 25 is represented as $V_{c1}$, and the reversal voltage of the second storage layer 35 is represented as $V_{c2}$, $V_{c1}$ being larger than $V_{c2}$.

For example, in a case where the magnetization directions of the first storage layer 25 and the second storage layer 35 are parallel to each other, it is sufficient that the reversal voltage $V_{c1}$ is applied to the first tunnel junction element 20 and the second tunnel junction element 30. With this arrangement, since the magnetization directions of the first storage layer 25 and the second storage layer 35 are both reversed in the direction corresponding to the polarity of the current, so that the first tunnel junction element 20 and the second tunnel junction element 30 may store information of (1, 1) or (0, 0).

On the other hand, in a case where the magnetization directions of the first storage layer 25 and the second storage layer 35 are antiparallel to each other, it is sufficient that the reversal voltage $V_{c2}$ is applied after the reversal voltage $V_{c1}$ is applied to the first tunnel junction element 20 and the second tunnel junction element 30. With this arrangement, after reversing the magnetization directions of the first storage layer 25 and the second storage layer 35 in the direction corresponding to the polarity of the current, only the magnetization direction of the second storage layer 35 may be reversed in the direction antiparallel to the magnetization direction of the first storage layer 25. Therefore, the first tunnel junction element 20 and the second tunnel junction element 30 may store information of (1, 0) or (0, 1).

Note that layer configurations of the first tunnel junction element 20 and the second tunnel junction element 30 may be structures in which the reference layer, the insulator layer, and the storage layer are laminated as illustrated in FIG. 2, but the technology according to the present disclosure is not limited to such an example.

For example, the first tunnel junction element 20 and the second tunnel junction element 30 may be a so-called laminated ferri-pin structure in which a magnetization fixing layer and a reference layer are magnetically coupled with each other by interposing a non-magnetic magnetization coupling layer such as Ru between the magnetization fixing layer and the reference layer. Furthermore, the laminated ferri-pin structure in which the magnetization coupling layer is interposed between the magnetization fixing layer and the reference layer may be provided below or above the storage layer. Moreover, the first tunnel junction element 20 and the second tunnel junction element 30 may have a so-called dual-MTJ structure in which the insulator layers are provided on both upper and lower sides of the storage layer.

However, in the magnetic storage element 10 according to the present embodiment, the first tunnel junction element 20 and the second tunnel junction element 30 have the same layer configuration. Specifically, in the first tunnel junction element 20 and the second tunnel junction element 30, films having the same functions are laminated in the same order. In such a case, the first tunnel junction element 20 and the second tunnel junction element 30 may have different cross-sectional shapes by controlling a post-process such as etching after laminating a common film at the same depositing step. Note that, in the first tunnel junction element 20 and the second tunnel junction element 30, the reversal voltages of the storage layers may be made different also by making the layer configurations different from each other; however, in such a case, the depositing step different for each tunnel junction element is required and a manufacturing step becomes complicated, which is not preferable.

Furthermore, the respective layers of the first tunnel junction element 20 and the second tunnel junction element 30 are formed using the same material. In such a case, the first tunnel junction element 20 and the second tunnel junction element 30 may have different cross-sectional shapes by controlling a post-process such as etching after laminating a common film at the same depositing step. Note that, in the first tunnel junction element 20 and the second tunnel junction element 30, the reversal voltages of the storage layers may be made different also by forming the respective layers using different materials; however, in such a case, the depositing step different for each tunnel junction element is required and the manufacturing step becomes complicated, which is not preferable.

Moreover, the respective layers of the first tunnel junction element 20 and the second tunnel junction element 30 are formed to have the same film thickness. In such a case, the first tunnel junction element 20 and the second tunnel junction element 30 may have different cross-sectional shapes by controlling a post-process such as etching after laminating a common film at the same depositing step. Note that, in the first tunnel junction element 20 and the second tunnel junction element 30, the reversal voltages of the storage layers may be made different also by forming the respective layers to have the different film thicknesses; however, in such a case, the manufacturing step becomes complicated, which is not preferable.

2.2. Specific Example

Figure 4:
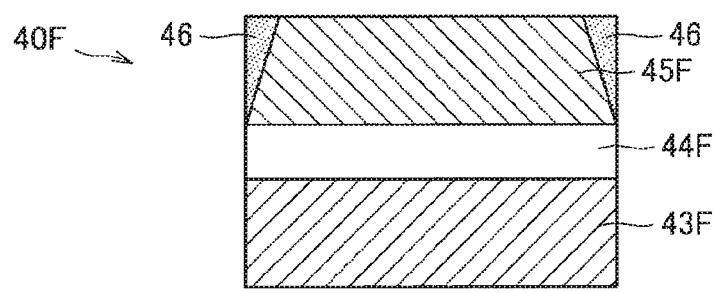
FIG. 4 is a schematic diagram illustrating an example of a cross-sectional structure of a tunnel junction element used in the magnetic storage element according to the embodiment.
Figure 5:
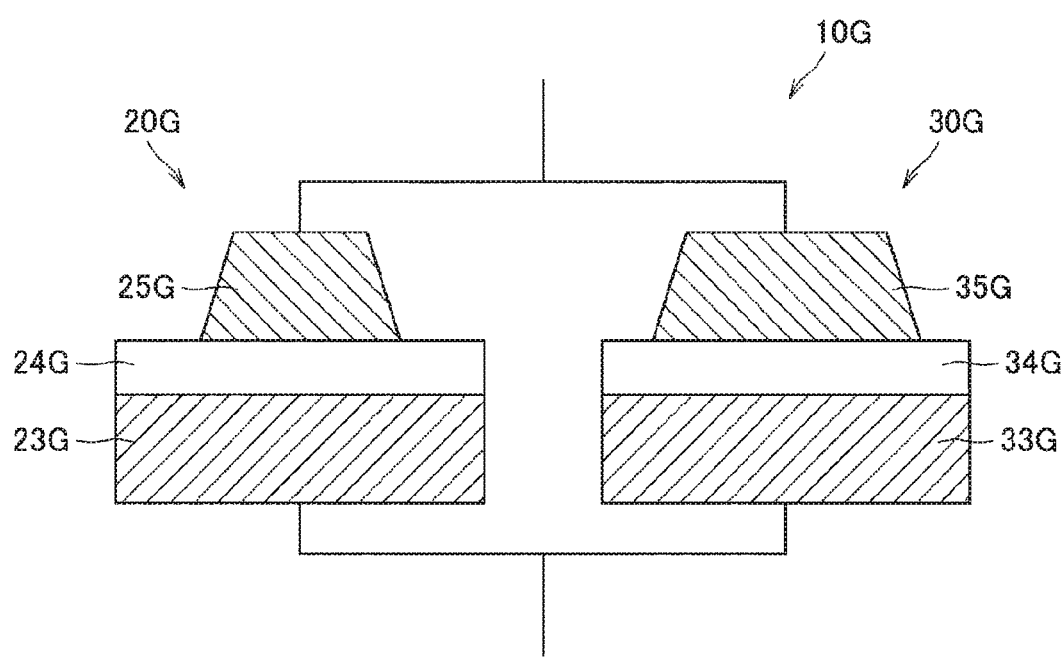
FIG. 5 is a schematic diagram illustrating a structure of the magnetic storage element according to the embodiment.

Subsequently, a specific example of the magnetic storage element 10 described above is described with reference to FIGS. 3A, 3b, 3C, 3D, 3E, 4, and 5. FIGS. 3A, 3B, 3C, 3D, and 3E are schematic diagrams illustrating an example of the cross-sectional shape of the tunnel junction element used in the magnetic storage element 10 according to the present embodiment, and FIG. 4 is a schematic diagram illustrating an example of a cross-sectional structure of the tunnel junction element used in the magnetic storage element 10 according to the present embodiment. Furthermore, FIG. 5 is a schematic diagram illustrating an example of a structure of a magnetic storage element 1OF according to the present embodiment.

Figure 3A:
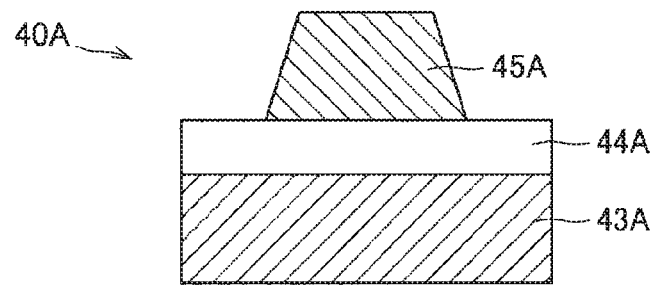
FIG. 3A is a schematic diagram illustrating an example of a cross-sectional shape of a tunnel junction element used in the magnetic storage element according to the embodiment.

For example, as illustrated in FIG. 3A, a tunnel junction element 40A may have a structure in which a reference layer 43A, an insulator layer 44A, and a storage layer 45A having a forward tapered shape in the laminating direction are sequentially laminated. In such a case, the tunnel junction element 40A may have a concave polygonal cross-sectional shape in which a trapezoid having a forward tapered shape is provided on a quadrature.

Figure 3B:
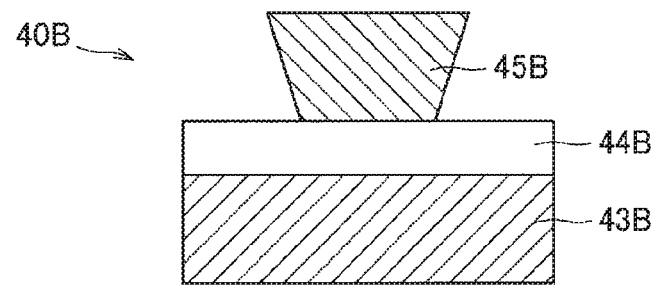
FIG. 3B is a schematic diagram illustrating an example of a cross-sectional shape of a tunnel junction element used in the magnetic storage element according to the embodiment.

Furthermore, as illustrated in FIG. 3B, a tunnel junction element 40B may have a structure in which a reference layer 43B, an insulator layer 44B, and a storage layer 45B having a reversed tapered shape in the laminating direction are sequentially laminated. In such a case, the tunnel junction element 40B may have a concave polygonal cross-sectional shape in which a trapezoid having a reversed tapered shape is provided on a quadrature.

Figure 3C:
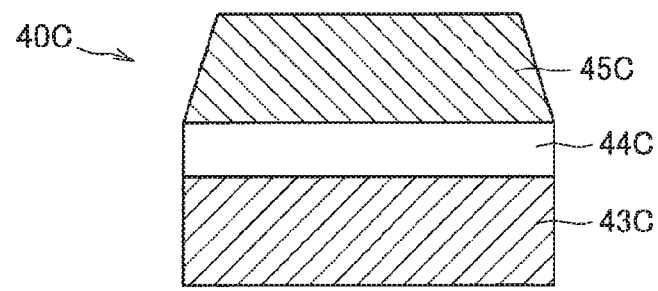
FIG. 3C is a schematic diagram illustrating another example of a cross-sectional shape of a tunnel junction element used in the magnetic storage element according to the embodiment.

Furthermore, as illustrated in FIG. 3C, a tunnel junction element 40C may have a structure in which a reference layer 43C, an insulator layer 44C, and a storage layer 45C having a forward tapered shape in the laminating direction with a width of a lower side being the same as a width of an upper side of the insulator layer 44 C are sequentially laminated. In such a case, the tunnel junction element 40C may have a hexagonal cross-sectional shape having a forward tapered shape in the laminating direction.

Figure 3D:
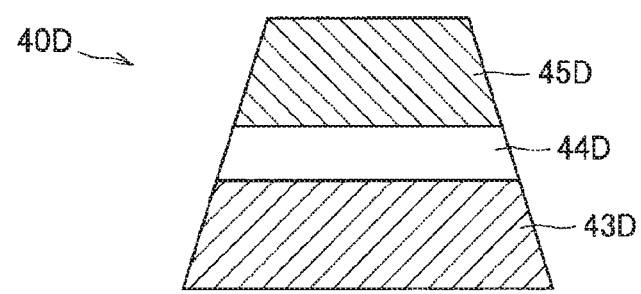
FIG. 3D is a schematic diagram illustrating another example of a cross-sectional shape of a tunnel junction element used in the magnetic storage element according to the embodiment.

Furthermore, as illustrated in FIG. 3D, a tunnel junction element 40D may have a structure in which three layers of a reference layer 43D having a forward tapered shape in the laminating direction, an insulator layer 44D, and a storage layer 45D are sequentially laminated. In such a case, the tunnel junction element 40C may have a trapezoidal cross-sectional shape having a forward tapered shape in the laminating direction.

According to the cross-sectional shapes illustrated in FIGS. 3A, 3B, 3C, and 3D, the magnetic film remaining around the storage layer has the magnetization component in the in-plane direction, thereby promoting the magnetization reversal of the storage layer having the magnetization direction perpendicular to the film surface, so that the reversal voltage of the storage layer may be reduced.

Figure 3E:
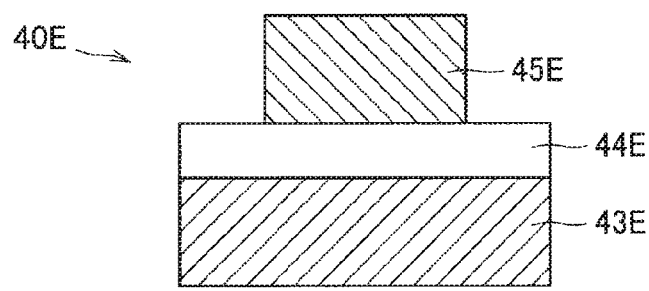
FIG. 3E is a schematic diagram illustrating another example of a cross-sectional shape of a tunnel junction element used in the magnetic storage element according to the embodiment.

For example, as illustrated in FIG. 3E, the tunnel junction element 40E may have a structure in which a reference layer 43E, and an insulator layer 44E and a storage layer 45E having a smaller planar shape area than that of the reference layer 43E are sequentially laminated. In such a case, the tunnel junction element 40E may have a concave polygonal cross-sectional shape in which a quadrature including the insulator layer 44E and the storage layer 45E is provided on a quadrature including the reference layer 43E.

Even with the cross-sectional shape illustrated in FIG. 3E, if at least the storage layer 45E is etched, the magnetic film remaining around the storage layer 45E has the magnetization component in the in-plane direction, so that the tunnel junction element 40E may promote the magnetization reversal of the storage layer 45E. Therefore, even with the cross-sectional shape illustrated in FIG. 3E, the tunnel junction element 40E may reduce the reversal voltage of the storage layer 45E.

Moreover, as illustrated in FIG. 4, the cross-sectional shape of the tunnel junction element 40F may be changed not by physical processing such as etching but by processing of an effective magnetic region by oxidation treatment or the like, for example. Specifically, the tunnel junction element 40F has a structure in which a reference layer 43F, an insulator layer 44F, and a storage layer 45F are sequentially laminated, and a partial region of the storage layer 45F may be converted to a non-magnetic inactive layer 46.

For example, the magnetic material may be converted to non-magnetic by oxidizing the magnetic material by the oxidation treatment. Therefore, after laminating the storage layer 45F to form the tunnel junction element 40F, a part of the magnetic material forming the storage layer 45F is oxidized, so that a partial region of the storage layer 45F may be converted to the non-magnetic inactive layer 46.

In other words, in FIG. 4, the cross-sectional shape of the tunnel junction element 40F represents a shape of a region including the reference layer 43F, the insulator layer 44F, and the storage layer 45F, and the inactive layer 46 is not included. With this arrangement, in the tunnel junction element 40F, it is possible to change the cross-sectional shape of the region having effective magnetism such as the storage layer 45F even without performing physical processing.

Furthermore, the inactive layer 46 which becomes non-magnetic due to the oxidation treatment may have a magnetic property again by performing reduction treatment. For example, it is also possible to return to the storage layer 45F having the magnetic property by performing the reduction treatment on the inactive layer 46 oxidized and demagnetized at the depositing step, a cleaning step or the like. Therefore, the tunnel junction element 40F may control the effective cross-sectional shape of the storage layer 45F by performing the oxidation treatment or the reduction treatment even without performing the physical processing such as the etching.

Moreover, as illustrated in FIG. 5, in a magnetic storage element 10G, as a combination of shapes of a first tunnel junction element 20G and a second tunnel junction element 30G, any combination may be selected as long as a ratio of a lower side to an upper side of the cross-section is different.

However, it is preferable to change the cross-sectional shapes of the first tunnel junction element 20G and the second tunnel junction element 30G according to a shape of a mask at the time of etching. Specifically, as illustrated in FIG. 5, the first tunnel junction element 20G and the second tunnel junction element 30G may be formed to have different cross-sectional shapes by making sizes of the regions of the first storage layer 25G and the second storage layer 35G masked at the time of etching different. Furthermore, the first tunnel junction element 20G and the second tunnel junction element 30G may be formed so that etching depths to the first storage layer 25G and the second storage layer 35G are the same.

With this arrangement, the magnetic storage element 10G may control the cross-sectional shapes of the first tunnel junction element 20G and the second tunnel junction element 30G by a simpler method.

As described above, the magnetic storage element 10 according to the present embodiment may store the multi-value information by a simpler structure by electrically connecting the plurality of tunnel junction elements in parallel and making the cross-sectional shapes of the plurality of tunnel junction elements connected in parallel different from each other.

3. Method of Manufacturing Magnetic Storage Element

Next, with reference to FIGS. 6 to 14, a method of manufacturing the magnetic storage element 10 according to the present embodiment is described. FIGS. 6 to 14 are cross-sectional views for explaining each step of manufacturing the magnetic storage element 10 according to the present embodiment. Note that, in the following, descriptions of a semiconductor substrate supporting the magnetic storage element 10, and electrodes and wiring connected to the magnetic storage element 10 are omitted.

Figure 6:
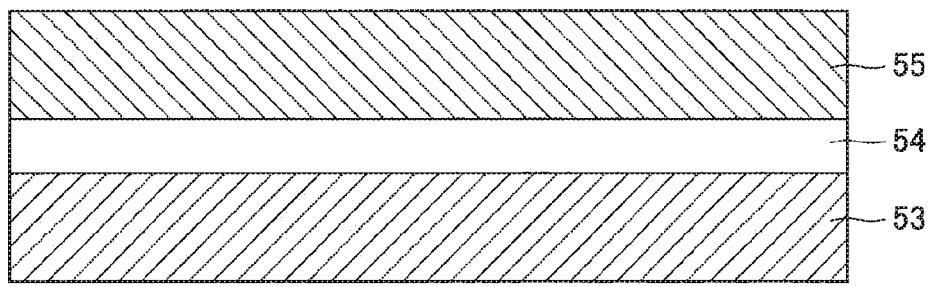
FIG. 6 is a cross-sectional view for explaining each step of manufacturing the magnetic storage element according to the embodiment.

First, as illustrated in FIG. 6, a reference layer 53, an insulator layer 54, and a storage layer 55 are sequentially laminated. Specifically, the reference layer 53 and the storage layer 55 may be formed by depositing a Co—Pt—B alloy or the like by a sputtering method. Furthermore, the insulator layer 54 may be formed by depositing metal such as Mg using the sputtering method or the like and then performing the oxidation treatment to convert the deposited metal into a metal oxide.

Figure 7:
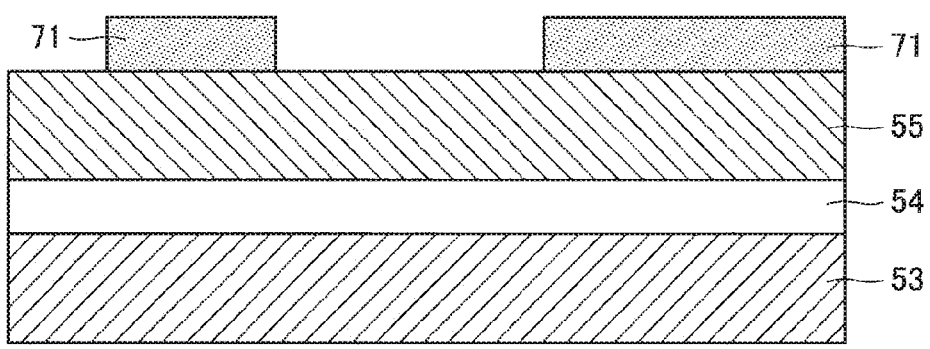
FIG. 7 is a cross-sectional view describing each process of manufacturing the magnetic storage element according to the embodiment.

Next, as illustrated in FIG. 7, after a resist layer 71 is formed on the storage layer 55, the resist layer 71 is patterned. Specifically, after a photoresist is applied on the storage layer 55 using a spin coating method or the like, a solvent of the photoresist is removed by heating to form the resist layer 71. Thereafter, the resist layer 71 is exposed using a photolithography method or the like and developed with a developer corresponding to the resist layer 71, and a patterned resist layer 71 is formed.

Note that, in FIG. 7, a region in which the patterned resist layer 71 remains is a region in which the first tunnel junction element 20 and the second tunnel junction element 30 are formed at a later step. For example, the resist layer 71 may be patterned so that the region in which the first tunnel junction element 20 is formed is smaller than the region in which the second tunnel junction element 30 is formed.

Figure 8:
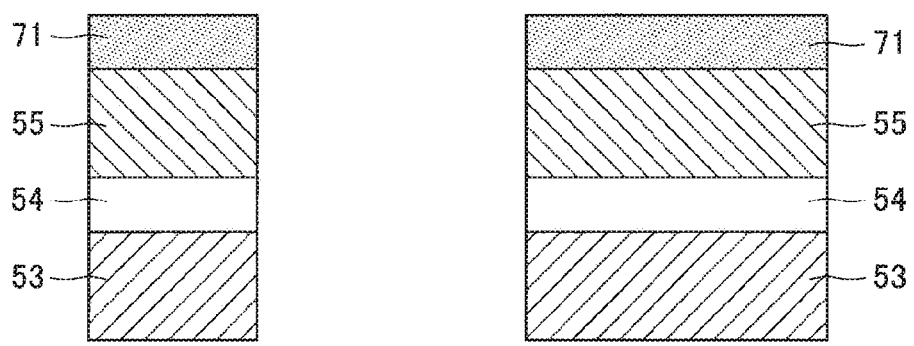
FIG. 8 is a cross-sectional view for explaining each step of manufacturing the magnetic storage element according to the embodiment.

Subsequently, as illustrated in FIG. 8, etching is performed using the patterned resist layer 71 as the mask. Specifically, etching is performed from the storage layer 55 to the reference layer 53 using $Cl_2$ gas or the like with the patterned resist layer 71 as the mask.

Figure 9:
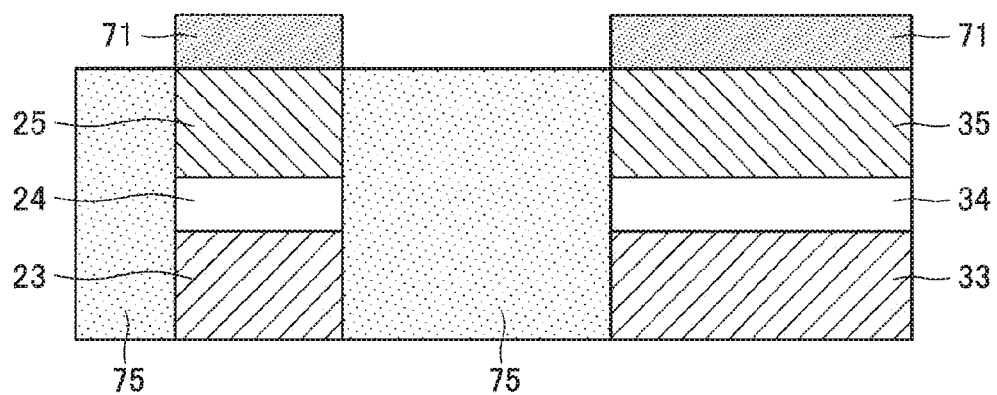
FIG. 9 is a cross-sectional view for explaining each step of manufacturing the magnetic storage element according to the embodiment.

Thereafter, as illustrated in FIG. 9, a region opened by the etching is filled with an insulator film 75. Specifically, by removing the insulator film 75 deposited on the resist layer 71 by a chemical mechanical polish (CMP) and the like after depositing the insulator film 75 of an oxide, nitride, or the like by using a chemical vapor deposition (CVD) method and the like, the region opened by the etching may be filled with the insulator film 75.

The tunnel junction element is divided into two at the step illustrated in FIG. 9. Specifically, the tunnel junction element is divided into the first tunnel junction element 20 in which the first reference layer 23, the first insulator layer 24, and the first storage layer 25 are laminated, and the second tunnel junction element 30 in which the second reference layer 33, the second insulator layer 34, and the second storage layer 35 are laminated.

Figure 10:
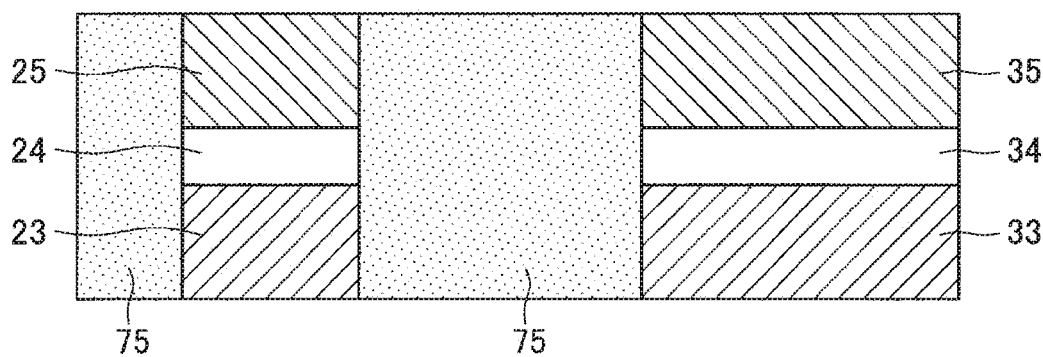
FIG. 10 is a cross-sectional view for explaining each step of manufacturing the magnetic storage element according to the embodiment.

Next, as illustrated in FIG. 10, the resist layer 71 is removed. Specifically, the resist layer 71 may be removed from an upper portion of the first storage layer 25 and the second storage layer 35 by a wet process such as sulfuric acid/hydrogen peroxide or a dry process such as asking.

Figure 11:
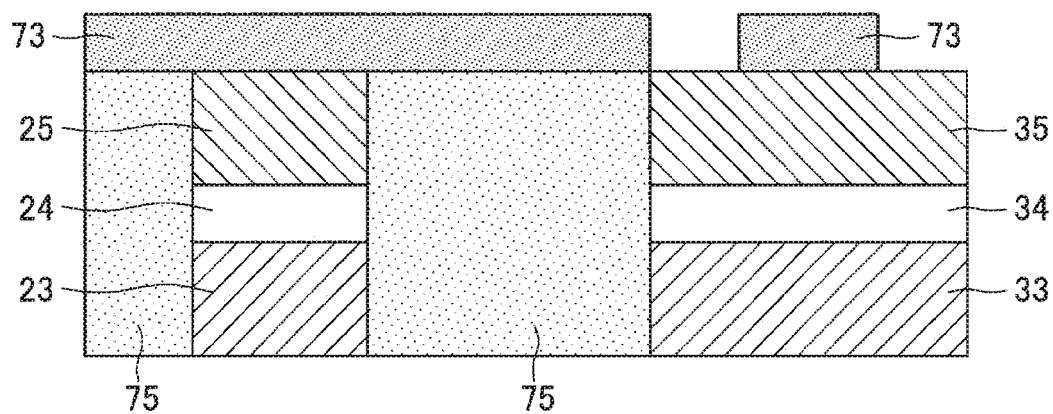
FIG. 11 is a cross-sectional view for explaining each step of manufacturing the magnetic storage element according to the embodiment.

Subsequently, as illustrated in FIG. 11, a resist layer 73 is formed on the first storage layer 25 and on the second storage layer 35, and then the resist layer 73 is patterned. Specifically, after a photoresist is applied on the first storage layer 25 and the second storage layer 35 using a spin coating method or the like, a solvent of the photoresist is removed by heating to form the resist layer 73. Thereafter, the resist layer 73 on the second storage layer 35 is patterned using a photolithography method or the like. At that time, the resist layer 73 on the second storage layer 35 may be patterned in an island shape near the center of the second storage layer 35.

Figure 12:
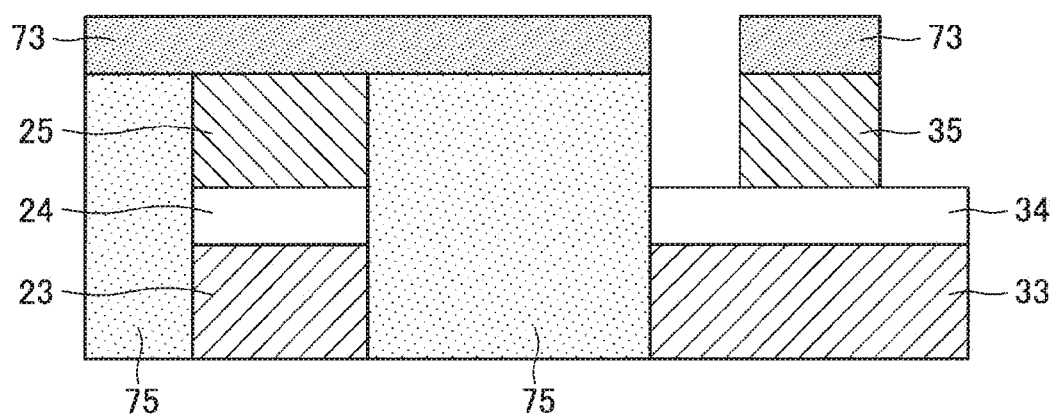
FIG. 12 is a cross-sectional view for explaining each step of manufacturing the magnetic storage element according to the embodiment.

Next, as illustrated in FIG. 12, etching of the second storage layer 35 is performed using the patterned resist layer 73 as the mask. Specifically, etching of the second storage layer 35 is performed by using $Cl_2$ gas or the like with the patterned resist layer 73 as the mask. It is preferable that the etching at that time is such that at least the second storage layer 35 is removed but not all the second storage layer 35, the second insulator layer 34, and the second reference layer 33 is removed. With this arrangement, the second tunnel junction element 30 may have a cross-sectional shape different from that of the first tunnel junction element 20.

Figure 13:
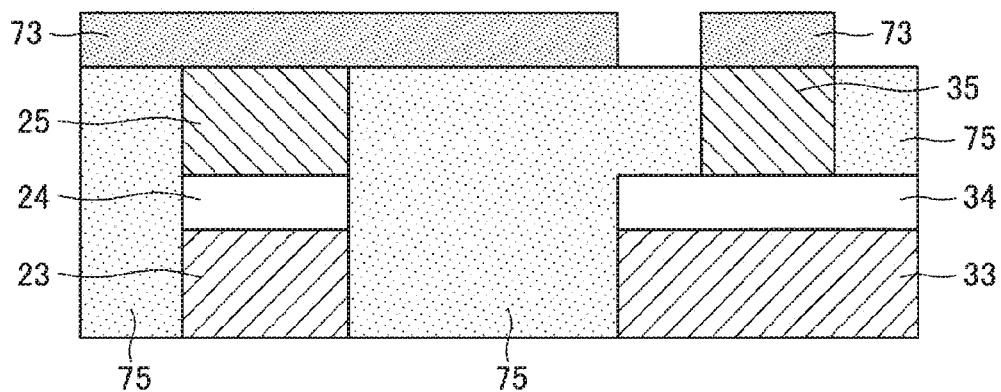
FIG. 13 is a cross-sectional view for explaining each step of manufacturing the magnetic storage element according to the embodiment.

Subsequently, as illustrated in FIG. 13, a region opened by the etching is filled with the insulator film 75. Specifically, by removing the insulator film 75 deposited on the resist layer 73 by CMP or the like after depositing the insulator film 75 of an oxide, a nitride or the like by using a CVD method or the like, the region opened by the etching may be filled with the insulator film 75.

Figure 14:
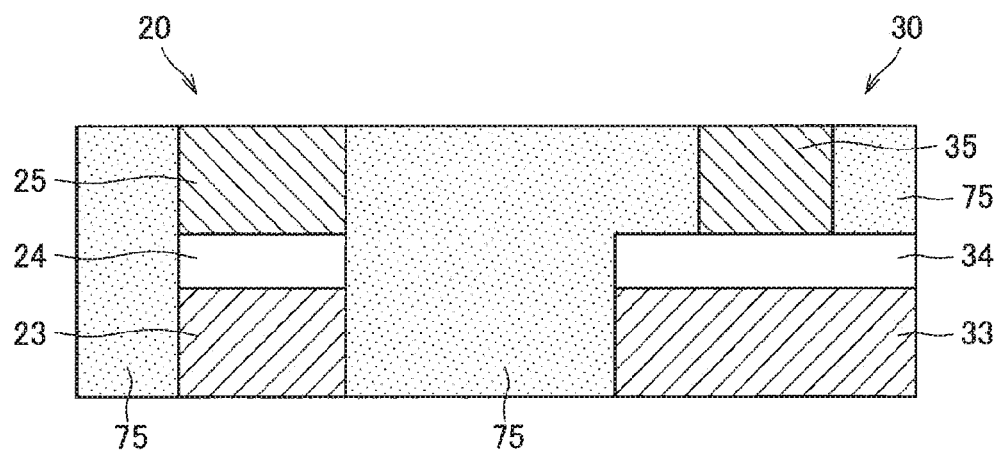
FIG. 14 is a cross-sectional view for explaining each step of manufacturing the magnetic storage element according to the embodiment.

Moreover, as illustrated in FIG. 14, the resist layer 73 is removed. Specifically, the resist layer 73 may be removed from an upper portion of the insulator film 75, the first storage layer 25, and the second storage layer 35 by a wet process such as sulfuric acid/hydrogen peroxide or a dry process such as asking.

Thereafter, the electrodes, wiring and the like are formed on both surfaces of the first tunnel junction element 20 and the second tunnel junction element 30, so that the magnetic storage element 10 according to the present embodiment may be manufactured.

4. EXAMPLE

Next, an example of the magnetic storage element according to the present embodiment is described with reference to FIGS. 15A and 15B. Note that the example described below is an example for explaining an effect of the magnetic storage element according to the present embodiment, and the magnetic storage element according to the present embodiment is not limited to the following example.

Example

First, a thermal oxide film having a thickness of 300 nm was formed on a silicon substrate having a thickness of 0.725 mm, and then a Cu film having a thickness of 100 nm to be a lower electrode and wiring was deposited.

Thereafter, an underlayer, a magnetization fixing layer, a magnetization coupling layer, a reference layer, an insulator layer, a storage layer, and a cap layer were sequentially laminated on the Cu film. Specifically, the underlayer was formed using a laminated film of Ta with a thickness of 10 nm and Ru with a thickness of 10 nm, the magnetization fixing layer was formed using Co—Pt with a thickness of 2 nm, the magnetization coupling layer was formed using Ru with a thickness of 0.7 nm, and the reference layer was formed using $((Co_{20}Fe_{80})_{80}B_{30}$ with a thickness of 1.2 nm. Furthermore, the insulator layer was formed using magnesium oxide with a thickness of 1 nm, the storage layer was formed using $(Co_{20}Fe_{80})_{80}B_{30}$ with a thickness of 1.6 nm, and the cap layer was formed using Ta with a thickness of 5 nm.

Note that each layer other than the insulator layer was formed by a sputtering method. Furthermore, the insulator layer was formed by depositing a metal film using the sputtering method and then participating in an oxidation chamber. Furthermore, after depositing the layers described above, heat treatment was performed at 350° C. for one hour in a heat treatment furnace in a magnetic field.

Thereafter, by processing the lower electrode, the two tunnel junction elements were electrically connected in parallel. Subsequently, one of the two parallelly connected tunnel junction elements was etched to an upper portion of the underlayer so that the storage layer has a cylindrical shape with a diameter of 50 nm to 100 nm (this tunnel junction element is referred to as MJTa). Furthermore, the other of the two tunnel junction elements was etched to an upper portion of the insulator layer so that the storage layer has a cylindrical shape with a diameter of 50 nm to 100 nm (this tunnel junction element is referred to as MJTb).

Next, $Al_2O_3$ was deposited to a thickness of about 100 nm by the sputtering method to embed the above-described two tunnel junction elements and electrically isolate them from each other. Thereafter, the upper electrode and the wiring were formed using Cu or the like to form the magnetic storage element according to the example.

As for the magnetic storage element formed as described above, a voltage was applied to each tunnel junction element to measure a reversal voltage in the magnetization direction of the storage layer. The results are illustrated in FIGS. 15A and 15B. FIG. 15A is a graph illustrating measurement of the reversal voltages in a low resistance state (a state in which the magnetization direction of the storage layer and the magnetization direction of the reference layer are parallel) of the two tunnel junction elements MJTa and MJTb. Furthermore, FIG. 15B is a graph illustrating measurement of the reversal voltages in a high resistance state (a state in which the magnetization direction of the storage layer and the magnetization direction of the reference layer are antiparallel) of the two tunnel junction elements MJTa and MJTb.

Figure 15A:
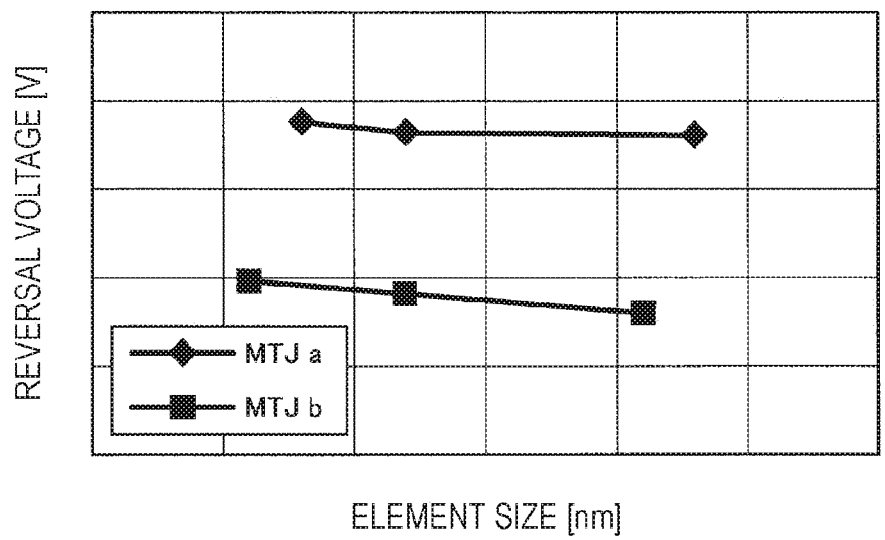
FIG. 15A is a graph illustrating measurement of the reversal voltages in a low resistance state of two tunnel junction elements MJTa and MJTb.
Figure 15B:
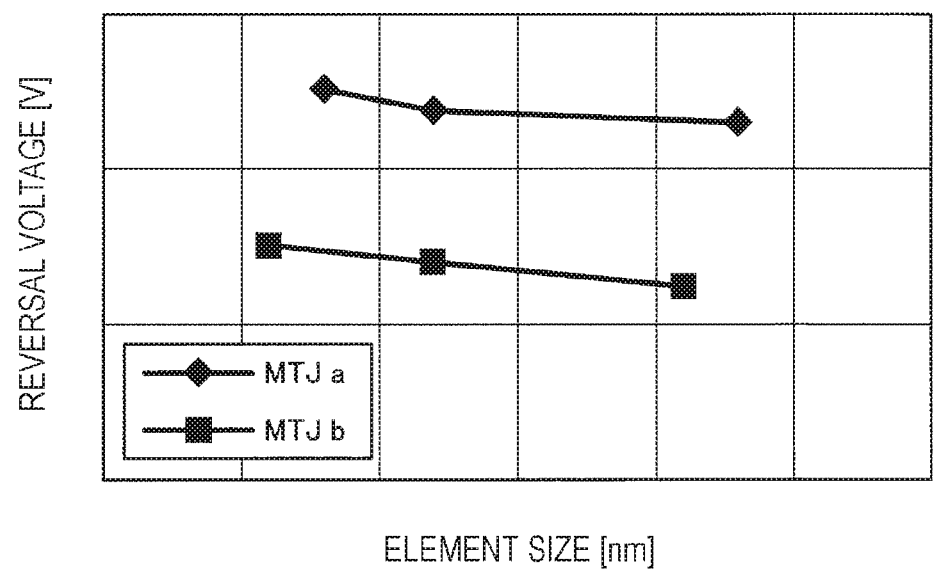
FIG. 15B is a graph illustrating measurement of the reversal voltages in a high resistance state of two tunnel junction elements MJTa and MJTb.

As illustrated in FIGS. 15A and 15B, in either state, it is understood that the reversal voltage is lowered in the tunnel junction element etched to the upper portion of the insulator layer with respect to the tunnel junction element etched to the upper portion of the underlayer. It is considered that this is because the magnetization reversal of the storage layer having the magnetization direction perpendicular to the film surface is promoted by the magnetic film remaining on the insulator layer having the magnetization component in the in-plane direction.

Therefore, in the magnetic storage element according to the present embodiment, the reversal voltage of the storage layer may be changed by changing the cross-sectional shape of the plurality of tunnel junction elements by etching or the like. Therefore, the magnetic storage element according to the present embodiment may store the multi-value information with a simpler structure by electrically connecting the plurality of tunnel junction elements with different reversal voltages in parallel.

5. Application Example of Magnetic Storage Element

Subsequently, an electronic device using the magnetic storage element according to the present embodiment is described with reference to FIGS. 16 and 17. For example, the electronic device may be provided with a magnetic storage device which serves as any of a large-capacity file memory, a code storage, or a working memory by arranging a plurality of magnetic storage elements according to the present embodiment in an array.

5.1. Appearance Example of Electronic Device

First, an appearance of an electronic device 100 using the magnetic storage element or the magnetic storage device according to the present embodiment is described with reference to FIG. 16. FIG. 16 is a perspective view illustrating an appearance example of the electronic device 100.

Figure 16:
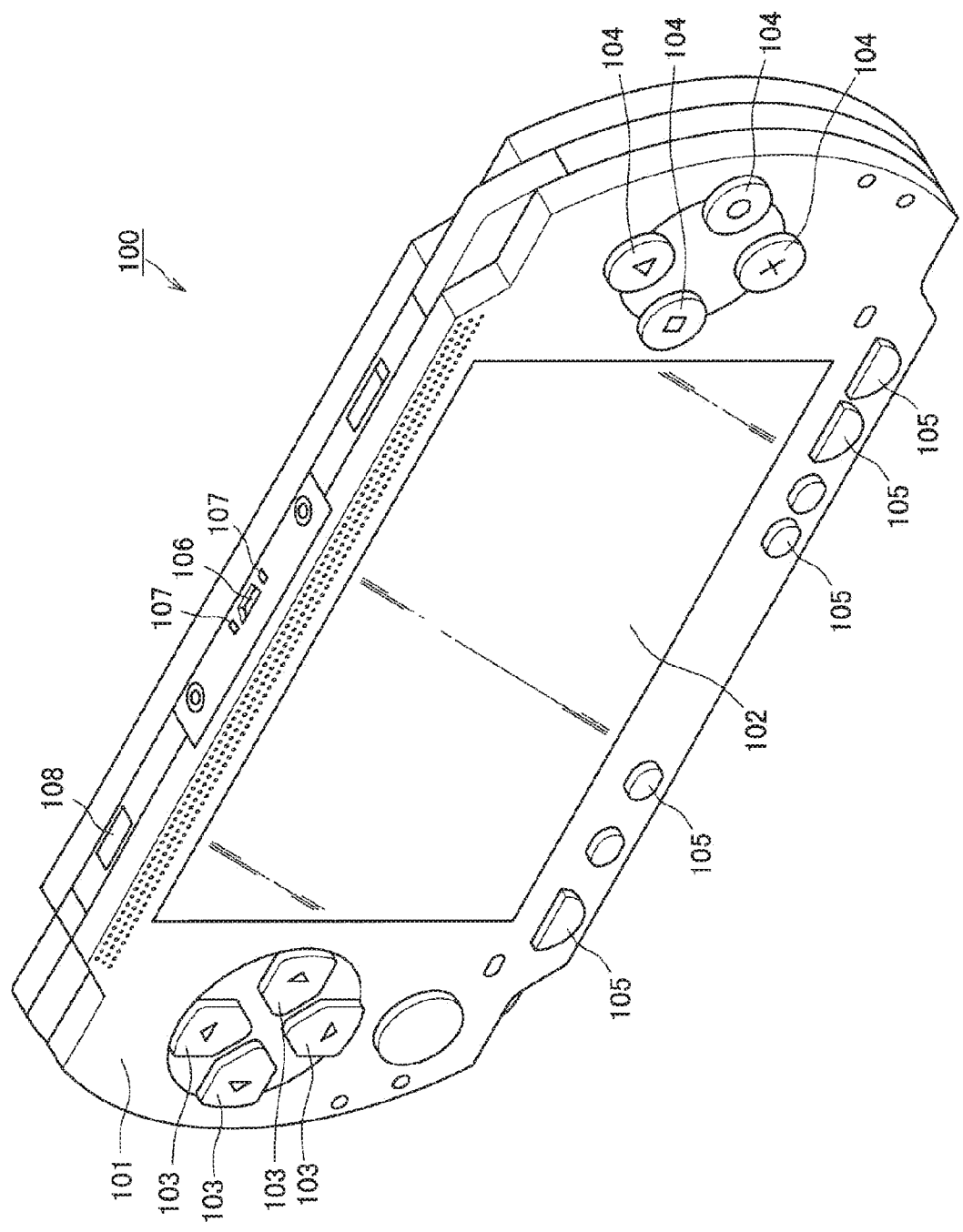
FIG. 16 is a perspective view illustrating an example of an appearance example of an electronic device according to one embodiment of the present disclosure.

As illustrated in FIG. 16, the electronic device 100 has the appearance in which each configuration is arranged inside and outside an outer casing 101 formed into a horizontally long flat shape, for example. The electronic device 100 may also be, for example, a device used as a game device.

A display panel 102 is provided on a front surface of the outer casing 101 at the center in a longitudinal direction. Furthermore, operation keys 103 and operation keys 104 which are arranged separately in a circumferential direction are provided on the left and right of the display panel 102. Furthermore, operation keys 105 are provided on a lower end of the front surface of the outer casing 101. The operation keys 103, 104, and 105 serve as direction keys, enter keys, or the like, and are used to select menu items displayed on the display panel 102, to advance a game and the like.

Furthermore, a connection terminal 106 for connecting an external device, a supply terminal 107 for power supply, a light receiving window 108 for performing infrared communication with an external device and the like are provided on an upper surface of the outer casing 101.

5.2. Configuration Example of Electronic Device

Next, an internal configuration of the electronic device 100 is described with reference to FIG. 17. FIG. 17 is a block diagram illustrating the internal configuration of the electronic device 100.

Figure 17:
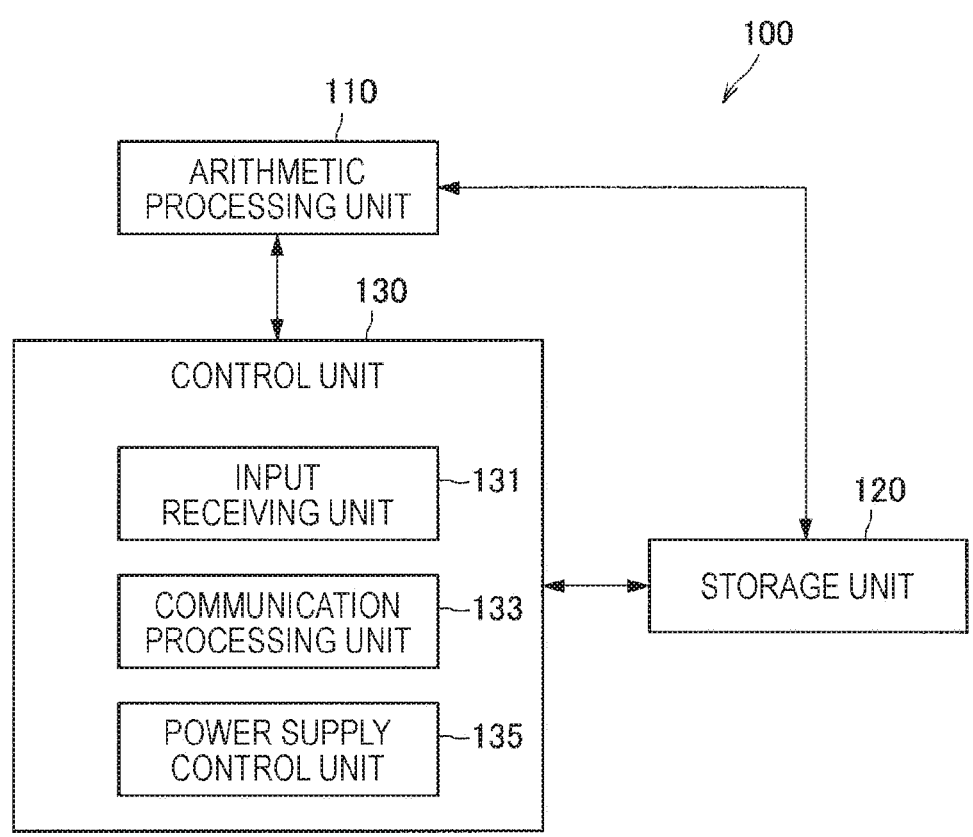
FIG. 17 is a block diagram illustrating an internal configuration of the electronic device according to the embodiment.

As illustrated in FIG. 17, the electronic device 100 is provided with an arithmetic processing unit 110 including a central processing unit (CPU), a storage unit 120 which stores various pieces of information, and a control unit 130 which controls each configuration of the electronic device 100. The arithmetic processing unit 110 and the control unit 130 are supplied with power from, for example, a battery not illustrated and the like.

The arithmetic processing unit 110 generates a menu screen for allowing a user to set various pieces of information or select an application. Furthermore, the arithmetic processing unit 110 executes the application selected by the user.

The storage unit 120 holds the various pieces of information set by the user. The storage unit 120 includes the magnetic storage element or the magnetic storage device according to the present embodiment.

The control unit 130 is provided with an input receiving unit 131, a communication processing unit 133, and a power control unit 135. The input receiving unit 131 detects, for example, states of the operation keys 103, 104, and 105. Furthermore, the communication processing unit 133 performs communication processing with the external device. Moreover, the power control unit 135 controls the power supplied to each unit of the electronic device 100.

According to the present embodiment, the storage unit 120 may realize a large capacity and low power consumption. Therefore, the electronic device 100 using the magnetic storage element or the magnetic storage device according to the present embodiment may perform arithmetic processing of a large amount of information with less power consumption.

Although the preferred embodiment of the present disclosure is described above in detail with reference to the attached drawings, the technical scope of the present disclosure is not limited to such examples. It is clear that one skilled in the art of this disclosure may conceive of various modifications and corrections within the scope of the technical idea recited in claims and it is understood that they also naturally belong to the technical scope of the present disclosure.

Furthermore, the effects described in this specification are merely illustrative or exemplary, and are not limitative. That is, the technology according to the present disclosure may exhibit other effects obvious to those skilled in the art from the description of this specification together with or in place of the above-described effects.

Note that, the following configuration is also within the technical scope of the present disclosure.

(1)

A magnetic storage element including:

a plurality of tunnel junction elements each of which includes a reference layer having a fixed magnetization direction, a storage layer capable of reversing a magnetization direction, and an insulator layer interposed between the reference layer and the storage layer, the plurality of tunnel junction elements electrically connected to each other in parallel, in which the plurality of tunnel junction elements has film configurations identical to each other, respective layers of the film configurations formed by using a same material to have a same thickness, and each of cross-sectional shapes obtained by cutting the plurality of tunnel junction elements in a laminating direction is a polygonal shape including upper and lower sides parallel to each other with a ratio of the lower side to the upper side different for each of the plurality of tunnel junction elements.

(2)

The magnetic storage element according to (1) described above, in which, in a cross-sectional shape of at least any one of the plurality of tunnel junction elements, a ratio of a lower side to an upper side of the storage layer is one or larger.

(3)

The magnetic storage element according to (1) described above, in which, in a cross-sectional shape of at least any one of the plurality of tunnel junction elements, a ratio of a lower side to an upper side of the storage layer is smaller than one.

(4)

The magnetic storage element according to any one of (1) to (3) described above, in which the plurality of tunnel junction elements has polygonal cross-sectional shapes with different numbers of apexes.

(5)

The magnetic storage element according to any one of (1) to (4) described above, in which at least cross-sectional shapes of storage layers are different from each other among the cross-sectional shapes of the plurality of tunnel junction elements.

(6)

The magnetic storage element according to any one of (1) to (5) described above, in which the storage layer reverses a magnetization direction on the basis of a direction of current flowing through the tunnel junction element.

(7)

The magnetic storage element according to (6) described above, in which voltages for reversing the magnetization direction of the storage layer are different from each other among the plurality of tunnel junction elements.

(8)

A magnetic storage device in which a plurality of magnetic storage elements is arranged in an array, each of the magnetic storage elements including: a plurality of tunnel junction elements each of which includes a reference layer having a fixed magnetization direction, a storage layer capable of reversing a magnetization direction, and an insulator layer interposed between the reference layer and the storage layer, the plurality of tunnel junction elements electrically connected to each other in parallel, in which the plurality of tunnel junction elements has film configurations identical to each other, respective layers of the film configurations formed by using a same material to have a same thickness, and each of cross-sectional shapes obtained by cutting the plurality of tunnel junction elements in a laminating direction is a polygonal shape including upper and lower sides parallel to each other with a ratio of the lower side to the upper side different for each of the plurality of tunnel junction elements.

(9)

An electronic device including:

a magnetic storage unit in which a plurality of magnetic storage elements is arranged in an array, each of the magnetic storage elements provided with a plurality of tunnel junction elements each of which includes a reference layer having a fixed magnetization direction, a storage layer capable of reversing a magnetization direction, and an insulator layer interposed between the reference layer and the storage layer, the plurality of tunnel junction elements electrically connected to each other in parallel, the plurality of tunnel junction elements having film configurations identical to each other, respective layers of the film configurations formed by using a same material to have a same thickness, each of cross-sectional shapes obtained by cutting the plurality of tunnel junction elements in a laminating direction being a polygonal shape including upper and lower sides parallel to each other with a ratio of the lower side to the upper side different for each of the plurality of tunnel junction elements; and an arithmetic processing unit which executes information processing on the basis of information stored in the magnetic storage unit.

(10)

A method of manufacturing a magnetic storage element, including:

a step of forming a laminate including a reference layer having a fixed magnetization direction, a storage layer capable of reversing a magnetization direction, and an insulator layer interposed between the reference layer and the storage layer;

a step of forming a plurality of tunnel junction elements by dividing the laminate by etching;

a step of changing a shape of at least the storage layer of the tunnel junction element which is etched by etching at least any one of the plurality of tunnel junction elements; and a step of electrically connecting the plurality of tunnel junction elements in parallel.

REFERENCE SIGNS LIST 1, 10 Magnetic storage element
2 Underlayer
3A Reference layer
3B Magnetization coupling layer
3C Magnetization fixing layer
4 Insulator layer
5 Storage layer
6 Cap layer
20 First tunnel junction element
23 First reference layer
24 First insulator layer
25 First storage layer
30 Second tunnel junction element
33 Second reference layer
34 Second insulator layer
35 Second storage layer

The invention claimed is:

1. A magnetic storage element, comprising:
a plurality of tunnel junction elements each of which includes a reference layer having a fixed magnetization direction, a storage layer capable of reversing a magnetization direction, and an insulator layer interposed between the reference layer and the storage layer, the plurality of tunnel junction elements electrically connected to each other in parallel, wherein
the plurality of tunnel junction elements has film configurations identical to each other, respective layers of the film configurations formed by using a same material to have a same thickness, and
each of cross-sectional shapes obtained by cutting the plurality of tunnel junction elements in a laminating direction is a polygonal shape including upper and lower sides parallel to each other with a ratio of the lower side to the upper side different for each of the plurality of tunnel junction elements.

2. The magnetic storage element according to claim 1, wherein, in a cross-sectional shape of at least any one of the plurality of tunnel junction elements, a ratio of a lower side to an upper side of the storage layer is one or larger.

3. The magnetic storage element according to claim 1, wherein, in a cross-sectional shape of at least any one of the plurality of tunnel junction elements, a ratio of a lower side to an upper side of the storage layer is smaller than one.

4. The magnetic storage element according to claim 1, wherein the plurality of tunnel junction elements has polygonal cross-sectional shapes with different numbers of apexes.

5. The magnetic storage element according to claim 1, wherein at least cross-sectional shapes of storage layers are different from each other among the cross-sectional shapes of the plurality of tunnel junction elements.

6. The magnetic storage element according to claim 1, wherein the storage layer reverses the magnetization direction on a basis of a direction of current flowing through a tunnel junction element of the plurality of tunnel junction elements.

7. The magnetic storage element according to claim 6, wherein voltages for reversing the magnetization direction of the storage layer are different from each other among the plurality of tunnel junction elements.

8. A magnetic storage device in which a plurality of magnetic storage elements is arranged in an array, each of the magnetic storage elements including: a plurality of tunnel junction elements each of which includes a reference layer having a fixed magnetization direction, a storage layer capable of reversing a magnetization direction, and an insulator layer interposed between the reference layer and the storage layer, the plurality of tunnel junction elements electrically connected to each other in parallel, wherein the plurality of tunnel junction elements has film configurations identical to each other, respective layers of the film configurations formed by using a same material to have a same thickness, and each of cross-sectional shapes obtained by cutting the plurality of tunnel junction elements in a laminating direction is a polygonal shape including upper and lower sides parallel to each other with a ratio of the lower side to the upper side different for each of the plurality of tunnel junction elements.

9. An electronic device, comprising:
a magnetic storage unit in which a plurality of magnetic storage elements is arranged in an array, each of the magnetic storage elements provided with a plurality of tunnel junction elements each of which includes a reference layer having a fixed magnetization direction, a storage layer capable of reversing a magnetization direction, and an insulator layer interposed between the reference layer and the storage layer, the plurality of tunnel junction elements electrically connected to each other in parallel, the plurality of tunnel junction elements having film configurations identical to each other, respective layers of the film configurations formed by using a same material to have a same thickness, each of cross-sectional shapes obtained by cutting the plurality of tunnel junction elements in a laminating direction being a polygonal shape including upper and lower sides parallel to each other with a ratio of the lower side to the upper side different for each of the plurality of tunnel junction elements; and
an arithmetic processing unit which executes information processing on a basis of information stored in the magnetic storage unit.

10. A method of manufacturing a magnetic storage element, comprising:
a step of forming a laminate including a reference layer having a fixed magnetization direction, a storage layer capable of reversing a magnetization direction, and an insulator layer interposed between the reference layer and the storage layer;
a step of forming a plurality of tunnel junction elements by dividing the laminate by etching;
a step of changing a shape of at least the storage layer of a tunnel junction element which is etched by etching at least any one of the plurality of tunnel junction elements; and
a step of electrically connecting the plurality of tunnel junction elements in parallel.

* * * * *